(12) United States Patent
Kawahito

(10) Patent No.: US 7,345,615 B2
(45) Date of Patent: Mar. 18, 2008

(54) CYCLIC MULTI-BIT A/D CONVERSION ARRAY AND IMAGE SENSOR

(75) Inventor: Shoji Kawahito, Hamamatsu (JP)

(73) Assignee: National University Corporation Shizuoka University, Shizuoka-shi (JP)

(*) Notice: Subject to any disclaimer, the term of this patent is extended or adjusted under 35 U.S.C. 154(b) by 0 days.

(21) Appl. No.: 10/577,490

(22) PCT Filed: Oct. 27, 2004

(86) PCT No.: PCT/JP2004/016286
§ 371 (c)(1),
(2), (4) Date: Apr. 27, 2006

(87) PCT Pub. No.: WO2005/041419
PCT Pub. Date: May 6, 2005

(65) Prior Publication Data
US 2007/0080842 A1 Apr. 12, 2007

(30) Foreign Application Priority Data
Oct. 29, 2003 (JP) ............................. 2003-368340

(51) Int. Cl.
H03M 1/34 (2006.01)
(52) U.S. Cl. .................. 341/162; 341/172; 341/155
(58) Field of Classification Search ................ 341/155, 341/144, 172, 122, 163, 161, 143
See application file for complete search history.

(56) References Cited

U.S. PATENT DOCUMENTS 5,212,486 A  5/1993  Nagaraj .................... 341/172

(Continued)

FOREIGN PATENT DOCUMENTS

JP      2-279021      11/1990

(Continued)

OTHER PUBLICATIONS

Supplementary European Search Report dated Sep. 18, 2006, issued in corresponding European Patent Application No. 04 79 3319.

(Continued)

Primary Examiner—Peguy JeanPierre
(74) Attorney, Agent, or Firm—Westerman, Hattori, Daniels & Adrian, LLP.

(57) ABSTRACT

An A/D conversion array for an image sensor, in which the number of amplifiers and capacitors are decreased, compared with the conventional cyclic type, and a function to cancel the noise generated in the pixel section of the image sensor is provided, so that the area and power consumption are decreased. After input signal Vin is supplied to C1 and held, a reset level is applied to Vin, whereby the signal is amplified by the ratio of C1 and C2 (C1/C2). An output is held in C1, and the output is A/D-converted by a comparator so that a control signal is generated by the conversion output and a switch is turned ON. The digital signal is converted into an analog signal, and the analog signal is subtracted from the signal held in C1. This signal is amplified and is subjected to A/D conversion again, and the same operation is repeated.

7 Claims, 11 Drawing Sheets

U.S. PATENT DOCUMENTS

| | | | |
|---|---|---|---|
| 5,644,313 A | 7/1997 | Rakers et al. | 341/163 |
| 5,894,284 A | 4/1999 | Garrity et al. | 341/172 |
| 6,097,326 A * | 8/2000 | Opris et al. | 341/161 |
| 6,259,393 B1 | 7/2001 | Ogawa et al. | 341/161 |
| 6,535,157 B1 | 3/2003 | Garrity et al. | 341/163 |
| 6,909,393 B2 * | 6/2005 | Atriss et al. | 341/163 |
| 7,102,560 B2 * | 9/2006 | Casper et al. | 341/163 |
| 2003/0001075 A1 | 1/2003 | Mukherjee et al. | 250/208.1 |

FOREIGN PATENT DOCUMENTS

| | | |
|---|---|---|
| JP | 11-27148 | 1/1999 |
| JP | 2002-261613 A | 9/2002 |

OTHER PUBLICATIONS

Nagaraj Krishnaswami; "Efficient Circuit Configurations for Algorithmic Analog to Digital Converters", IEEE Transactions on Circuits and Sytems, vol. 40, No. 12, Dec. 1993, pp. 777-785.

International Search Report of PCT/JP2004/016286, dated Nov. 22, 2004.

Steven Decker et al.: "A 256 CMOS Imaging Array with Wide Dynamic Range Pixcels and Column-Parallel Digital Output" IEEE Journal of Solid-State Circuits, IEEE Service Center, Piscataway, NJ, US, vol. 33, No. 12, Dec. 1998.

Garrity D et al.: "A 10 bit, 2Ms/s, 15 mW BiCMOS cyclic RSD A/D converter" Bipolar/BICMOS Circuits and Technology Meeting, 1996., Proceeding of the 1996 Minneapolis, MN, USA Sep. 29-Oct. 1 1, New York, NY, USA, IEEE, Sep. 29, 1996, pp. 192-195.996.

Supplementary European Search Report dated Sep. 25, 2006, issued in corresponding European Patent Application No. 04 79 3319.7.

* cited by examiner

CYCLIC MULTI-BIT A/D CONVERSION ARRAY AND IMAGE SENSOR

TECHNICAL FIELD

The present invention relates to a technology for integrating an A/D converter on the column of an image sensor, particularly of a CMOS image sensor, performing digital output, and also enabling signals to be read at high-speed. This technology is useful for an image sensor having a function to intensively read the signals from the image sensor in a short time and for an image sensor for high-speed imaging.

BACKGROUND ART

The following are the prior art for performing A/D conversion in columns of a CMOS image sensor.
[1] U.S. Pat. No. 2,532,374 Description
[2] A. Simoni, A. Sartori, M. Gottaidi, A. Zorat, "A digital vision sensor", Sensors and Actuators, A 46-47, pp. 439-443, 1995
[3] T. Sugiki, S. Ohsawa, H. Miura, M. Sasaki, N. Nakamura, I. Inoue, M. Hoshino, Y. Tomizawa, T. Arakawa, "A 60 mW 10b CMOS image sensor with column-to-column FPN reduction", Dig. Tech. Papers, Int. Solid-State Circuits Conf., pp. 108-109, 2000
[4] B. Mansoorian, H. Y. Yee, S. Huang, E. Fossum, "A 250 mW 60 frames/s 1280×720 pixel 9b CMOS digital image sensor", Dig. Tech. Papers, Int. Solid-State Circuits Conf., pp. 312-313, 1999
[5] S. Decker, R. D. McGrath, K. Bremer, C. G. Sodini, "A 256×256 CMOS imaging array with wide dynamic range pixels and column-parallel digital output", IEEE J. Solid-State Circuits, Vol. 33, No. 12, December 1998
[6] K. Nagaraj, "Efficient circuit configuration for algorithmic analog to digital converters", IEEE Transactions on Circuits and Systems II: Analog and digital signal processing, Vol. 40, NO. 12, pp. 777-785, December 1993

[1] concerns 8-bit integrating A/D converter elements integrated in columns using a lamp signal generator, comparator and register. A similar technology is also reported in [2]. [3] also concerns integrating A/D converter elements in columns, where 10b is implemented using a higher precision comparator. In these integrating A/D converters, the conversion time is long, and in particular increasing the resolution increases the conversion time exponentially, and higher resolution cannot be expected in this status. The advantage, however, is that linearity is good.

[4] reports that operating serial comparison type A/D converters are arrayed in columns and operated using a capacitor, with which high-speed A/D conversion can be possible, so this technology is suitable for an image sensor with a high frame rate and a high number of pixels. The actually accuracy, however, is still about 8-bits. [5] reports on arranging and operating two stages of cyclic type A/D converter elements in columns, which is also suitable for high-speed A/D conversion. However the circuit scale is large since two amplifiers are used. [6] seems to be similar to the present invention, but has a different way of using a capacitor, and is not considered for integrating it.

Beside the above, some image sensors having A/D conversion elements in pixels have been reported, but these are not directly related to the present invention, and are therefore omitted here.

The circuits in [5] of the prior art, which is most closely related to the present invention, will be described. In this prior art, two stages of 1-bit A/D conversion circuits are cascade-connected, and cyclic type A/D conversion is performed by returning the output thereof to input as shown in FIG. 1. In this method, an amplifier is required for each stage, which increases an area and also increases power consumption. If this technology is used as an A/D converter to be integrated in the column of an image sensor, three amplifiers, including an amplifier for noise cancellation and an amplifier for an A/D converter, are required for each column.

DISCLOSURE OF THE INVENTION

FIG. 2 shows the configuration of the CMOS image sensor of the present invention, where an A/D converter is integrated into a column. The signals which are read to the column read circuit in column units are first noise-cancelled, and the signals are supplied to the cyclic A/D conversion circuit for each pixel. Here A/D conversion at a required-resolution is performed, and the digital values are read by horizontal scanning. Since this is high-speed signal reading, all the digital values are not horizontally scanned in series, but a plurality of outputs are created and horizontal scanning is performed in parts in parallel, or ADC (Analog Digital Converter) outputs are multiplexed as shown in FIG. 3, and digitized signals are output in parallel via a plurality of lines, or many other methods may be used. As mentioned later, in FIG. 2 and FIG. 3, a portion of 1, that is the noise canceller and the cyclic ADC, may be integrated using one amplifier.

BEST MODE FOR CARRYING OUT THE INVENTION

As described below, a redundant expression to take three values, binaries −1, 0 and 1, for example, per cycle is used as the cyclic A/D conversion, but in order to decrease the number of data output lines, the redundant expression is finally converted into a non-redundant expression, then the digital data is horizontally scanned (or partially horizontally scanned in the case of parallel output), and is output. If the data rate of output is low, the redundant expression may be converted into a non-redundant expression after horizontal scanning. This conversion can be performed using an adder which performs N+1 digits of addition in the case of N-bits.

EXAMPLE 1

Figure 4:
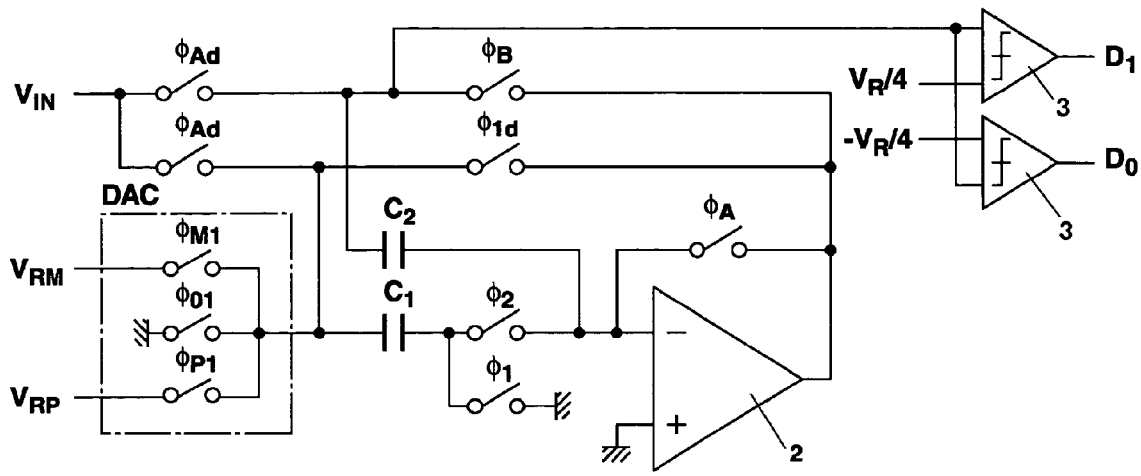
FIG. 4 is a diagram depicting a circuit configuration example of the cyclic A/D converter which performs 1.5-bit A/D conversion each time.

The present invention is characterized in that the number of amplifiers and the number of capacitors are decreased in order to perform cyclic A/D conversion. FIG. 4 shows a circuit example of the cyclic A/D converter of the present invention which performs 1-bit or 1.5-bit A/D conversion per cycle. This function is equivalent to that of FIG. 6.

Figure 5:
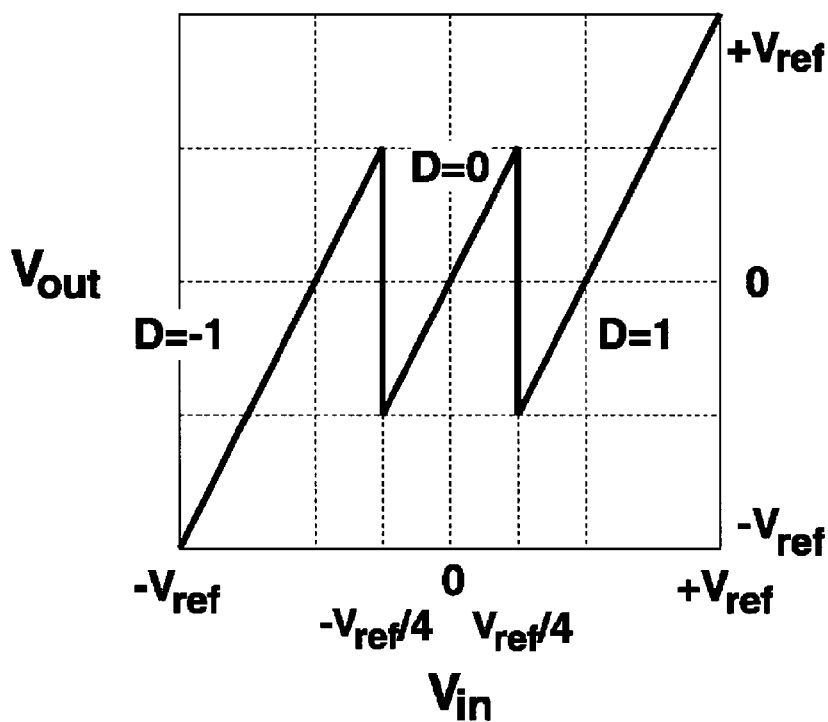
FIG. 5 is a diagram depicting the conversion characteristics of the cyclic A/D converter which performs 1.5-bit A/D conversion per cycle.

FIG. 5 shows the conversion characteristics of the cyclic A/D converter in FIG. 4. In FIG. 4, $V_{RM}$ and $V_{RP}$ correspond to Vref and −Vref in FIG. 5. The relationship between the digital outputs D0 and D1 in FIG. 4, and D and the input signal Vin to the comparator (3) in FIG. 5 is as follows.

[Expression 1]

$$D = \begin{cases} 1 & (D_1 = 1, D_0 = 1) \quad (V_{in} > V_{ref}/4) \\ 0 & (D_1 = 0, D_0 = 1) \quad (V_{ref}/4 \geq V_{in} \geq -V_{ref}/4) \\ -1 & (D_1 = 0, D_0 = 0) \quad (-V_{ref}/4 > V_{in}) \end{cases} \quad (1)$$

In other words, the input is divided into three areas: (1) from Vref to −Vref/4, (2) −Vref/4 to Vref/4 and (3) Vref/4 to Vref, and three value A/D conversion is performed on these areas, and digital codes −1, 0 and 1 are assigned. The first code becomes the most significant digit. Operation is performed according to the characteristics in FIG. 4, and output is generated. This operation is given by the following expression.

[Expression 2]

$$V_{out} = 2V_{in} - D \times V_{ref} \quad (2)$$

In other words, A/D conversion is performed sequentially from the significant digit, input is doubled, and a predetermined value is subtracted from the A/D converted value, so that the output always comes within a ±Vref range, and by supplying this result to the input again and repeating the same procedure, multi-bit A/D conversion is performed. At this time, A/D conversion is performed with three values each time (1 digit), so redundancy is generated in the digital value. By this redundancy, a precision demanded for the comparator is considerably relaxed, and high precision A/D conversion becomes possible.

Figure 6:
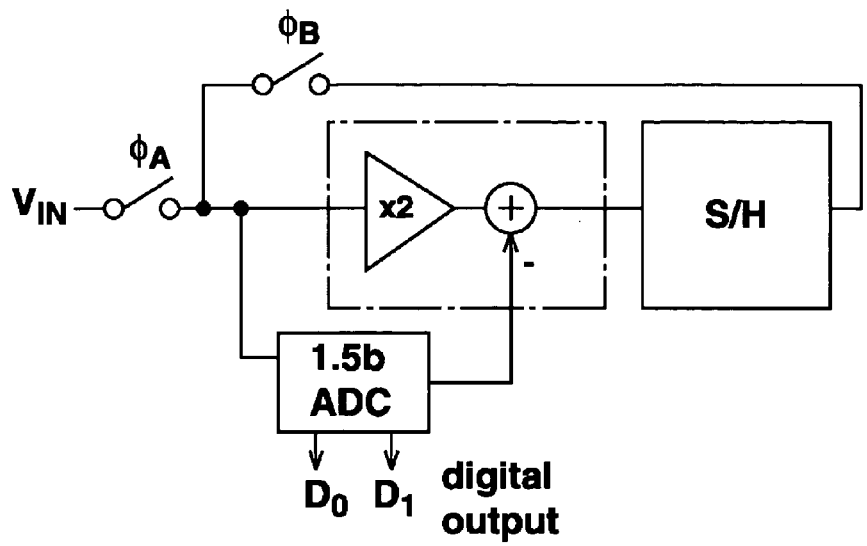
FIG. 6 is a block diagram equivalent to the cyclic A/D converter which performs 1.5-bit A/D conversion per cycle.

In the case of a binary number, each digit takes two values, 0 or 1, but in the case when each digit takes three values, −1, 0 and 1, this is regarded that 1.5-bit A/D conversion is performed in each stage. Actual operation is, as shown in FIG. 6, that a switch by the control signal φA (hereafter φA) is turned ON, the input signal is supplied, and 1.5-bit operation is performed for each stage. Depending on the result, operation is performed according to Expression (2). This output is stored in the S/H (Sample and Hold) circuit. This completes the first 1 cycle. Then switch by the control signal φB (hereafter φB) is turned ON, the switch by φA is turned OFF, output of the S/H circuit is supplied to the 1.5-bit A/D converter, and the same operation is repeated. After repeating this N times, N+1 bits of A/D conversion can be performed.

Figure 7:
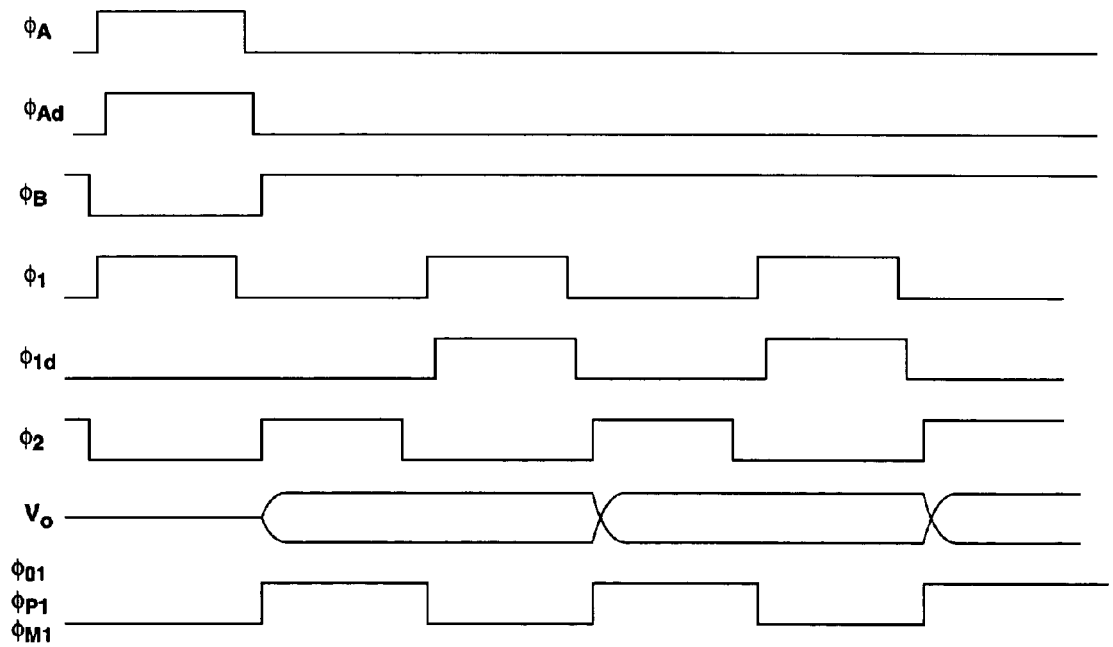
FIG. 7 is a timing chart depicting the operation of the A/D converter in FIG. 4.

FIG. 4 shows the circuits which implement functions which are the same as FIG. 6, but require less number of amplifiers and capacitors. FIG. 7 shows the operation timing chart thereof. FIG. 7 shows up to the third cycle.

In FIG. 4, Vin is sampled first to C1 and C2, then C2 is connected between the input and output of the inverting amplifier (2), and 1.5-bit A/D conversion is performed based on Expression (1) using the two comparators. C1 is connected to the D/A converter. By this, the following expression is computed.

[Expression 3]

$$V_{out}(0) = \left(1 + \frac{C_1}{C_2}\right)V_{in} - D(0) \times \frac{C_1}{C_2}V_{ref} \quad (3)$$

If C1=C2, Expression (3) is equivalent to Expression (2). Here Vout (0) is the output of the first cycle, and D (0) is the first A/D conversion value, that is the value of the most significant digit. In order to sample and hold this output, the S/H circuit is created in FIG. 6, but in FIG. 4, capacitors and switches are controlled so as to implement a processing equivalent thereto. Vout (0) has been stored in C2. So by using C1, the voltage between Vout (0) and the ground point is stored, and according to the result of the A/D conversion, C1 is reconnected between the DAC (Digital Analog Converter) and the inverting amplifier (2), then charges in proportion to the difference, that is

[Expression 4]

$$Q = C_1(V_{out}(0) - D(1)V_{ref}) \quad (4)$$

are transferred to C2, and as a result the following expression is executed.

[Expression 5]

$$V_{out}(1) = V_{out}(0) + \frac{C_1(V_{out}(0) - D(1)V_{ref})}{C_2} \quad (5)$$

$$= \left(1 + \frac{C_1}{C_2}\right)V_{out}(0) - \frac{C_1}{C_2}D(1)V_{ref}$$

This is repeated for the required number of cycles.

By the configuration in FIG. 4, the A/D converter is comprised of one inverting amplifier (2) and two capacitors. Since the circuit configuration is simple, a plurality of these A/D converters can be arranged, and input signals are supplied in parallel, so that high-speed A/D conversion can be implemented.

Now basic operation of the circuits will be described. First both the capacitors C1 and C2 are connected to the input (Vin), and each is charged with voltage Vin. If the respective charges are Q1 and Q2, then Q1=C1·Vin, and Q2=C2·Vin. Then one terminal of the capacitor C2 is connected to the output terminal of the inverting amplifier (2). In other words, the charges of Q2 have been filled in the capacitor C2 from the beginning. One terminal of the capacitor C1 is switched to be connected to the DAC (Digital Analog Converter). If the output voltage of the DAC is Vdac, the terminal voltage of the capacitor C1 changes from Vin to Vdac. So the change of the charges stored in the capacitor C1 become ΔQ1=C1 (Vin−Vdac), and this changed amount is transferred to the capacitor C2. As a result, the final output becomes Vout= (Q2+ΔQ1)/C2=((C1+C2) Vin−C1·Vdac)/C2. If C1=C2 is selected, then Vout=2Vin−Vdac, so the basic operation of cyclic A/D conversion, where the input is doubled then the output of the DAC is subtracted, can be implemented. The conventional cyclic type has an S/H circuit in the output of the amplifier, and the output of the S/H circuit is sampled and cycled, so the above mentioned basic operation is repeated.

In the case of the circuits proposed by the present inventor, this operation is performed by one amplifier, so the above mentioned voltage Vin becomes the output voltage Vout of the amplifier at the cyclic operation, therefore Vin in the above mentioned "charge C2 with Vin" corresponds to Vout during the cyclic operation. In other words, C2 has been charged with Vin (=Vout) from the beginning, so only C1 is initially connected to Vout (=Vin), then connection is simply switched to the DAC, whereby Vout=2Vin−Vdac can be computed. In this case as well, C1=C2 is selected. By this, the number of capacitors can be decreased compared to the prior art.

In the case of performing both the noise cancellation operation, which will be described later, and the cyclic A/D conversion operation, C1 is connected between the input Vin and the input of the inverting amplifier, and C2 is connected between the input and output of the inverting amplifier. The charges of C2 are initialized (Q2=0) in advance, and one end of C1 is changed form Vs (signal voltage) to VR (reset voltage) to cancel the noise. As a result, if C1=C2 has been selected, Vout=ΔQ1/C2=C1 (VS−VR)/C2=Vs−VR, so even if the gain is 1, noise cancellation is performed by subtracting VR from VS. Then the cyclic A/D conversion operation is started.

EXAMPLE 2

Figure 8:
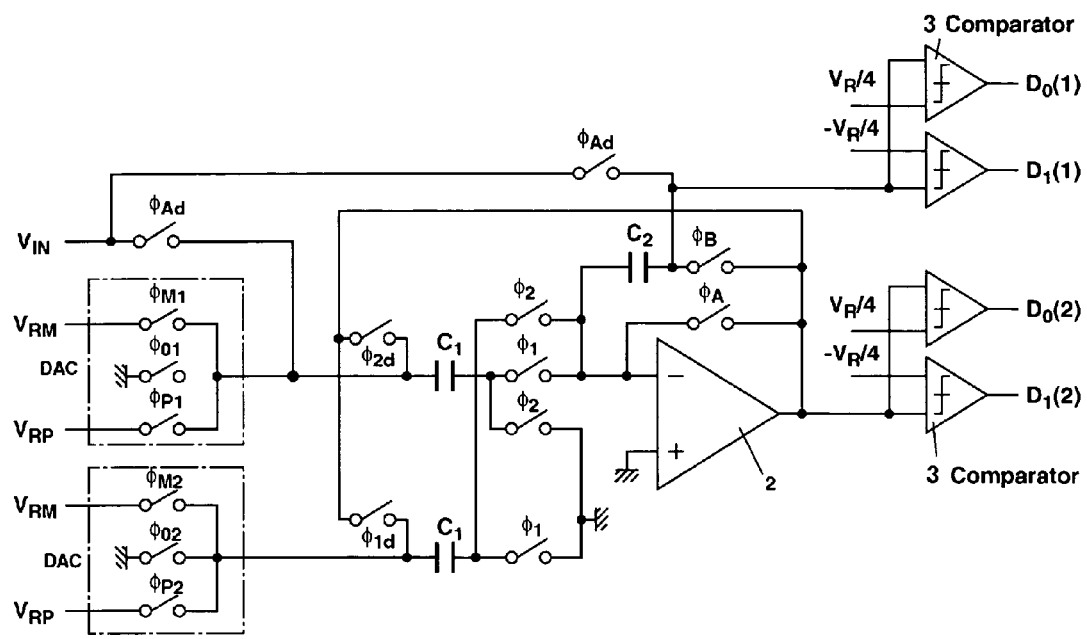
FIG. 8 is a diagram depicting the cyclic A/D converter which performs 1.5-bit A/D conversion in a half cycle.
Figure 9:
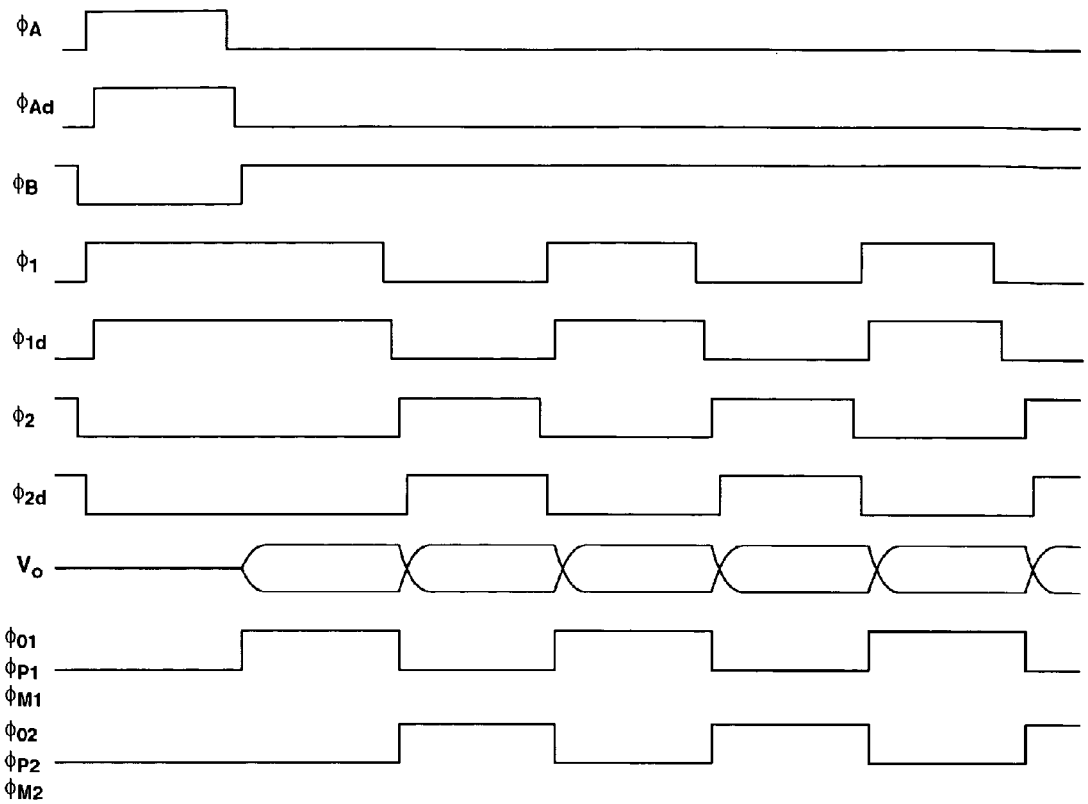
FIG. 9 is a timing chart depicting the operation of the circuit in FIG. 8.

FIG. 8 shows an example of circuit wherein 1.5-bit A/D conversion can be performed in half a clock by adding capacitors and using them alternately. FIG. 9 shows an operation timing chart thereof. FIG. 8 shows up to the second cycle, where four digits of 1.5-bit A/D conversion is executed in two cycles.

In this case, two sets of comparators (3) are used for A/D conversion, but only one set of comparators may be used if a switching means is created for switching the input and output of one set of comparators, and time division is used.

EXAMPLE 3

Figure 1:
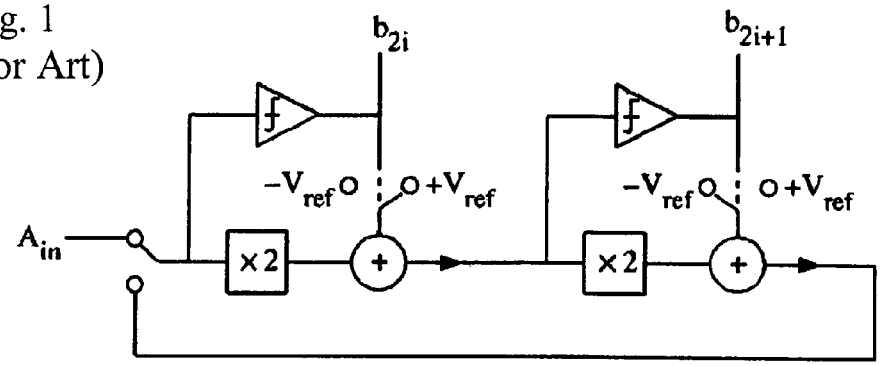
FIG. 1 is a diagram depicting a two-stage cyclic A/D converter (prior art)
Figure 2:
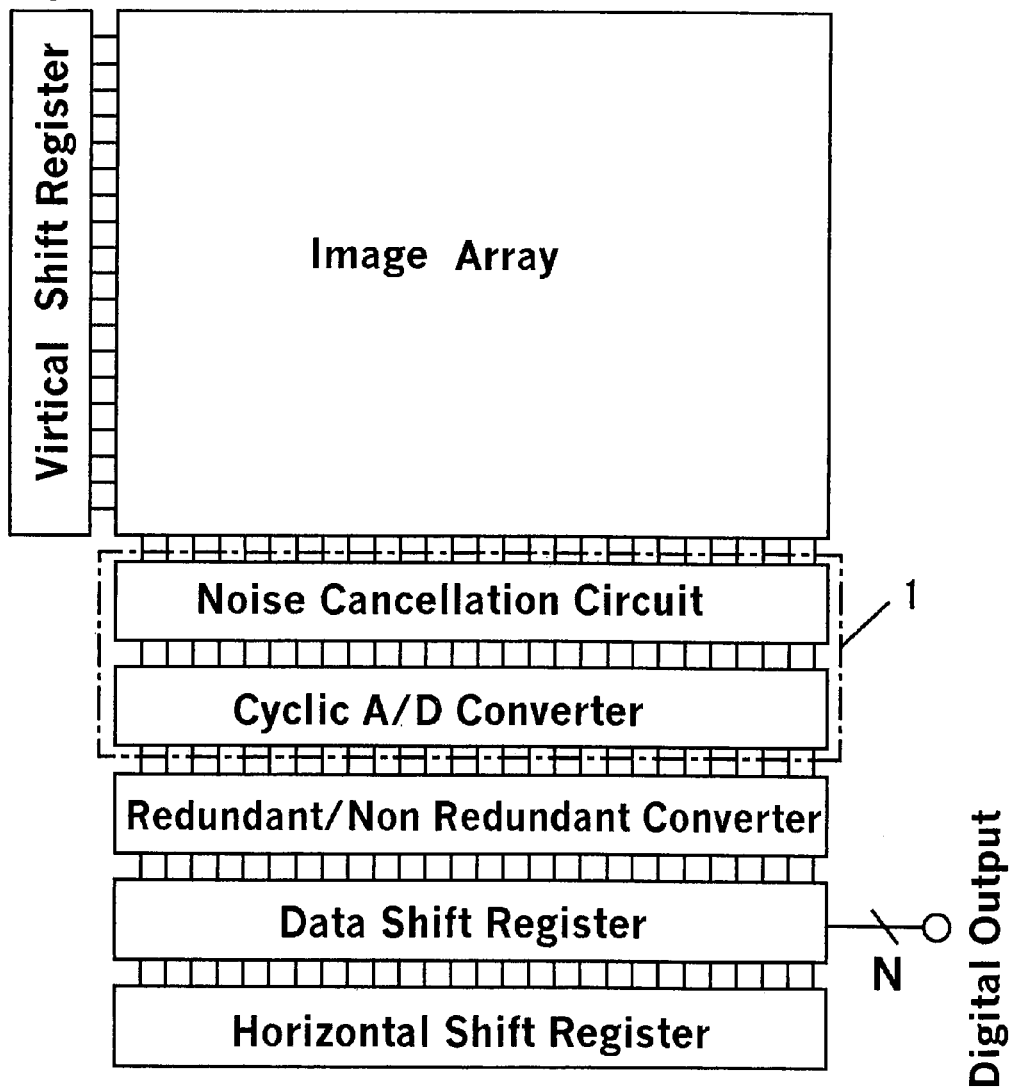
FIG. 2 is a diagram depicting the configuration of the image sensor in which the cyclic A/D converter is integrated into a column.
Figure 3:
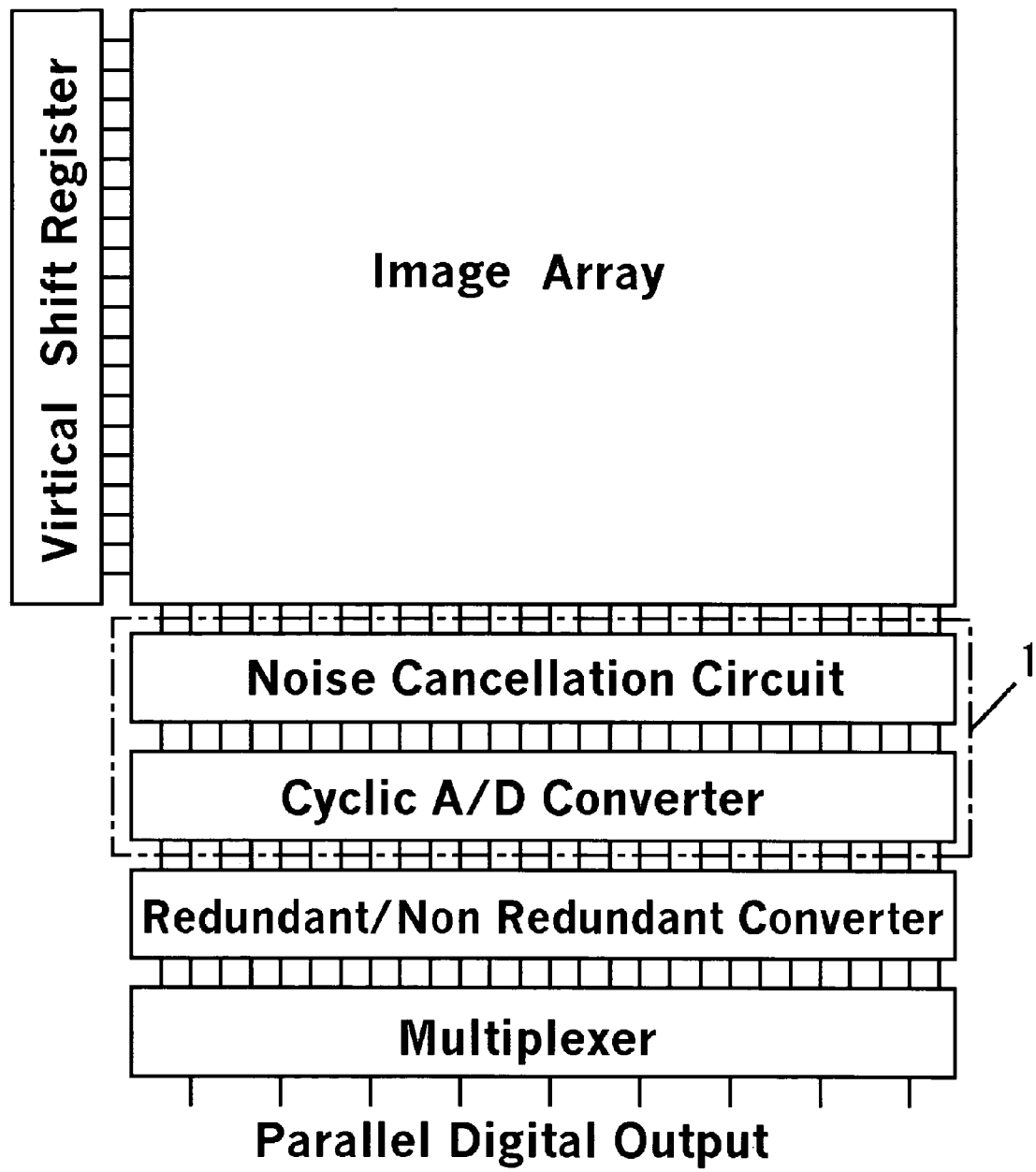
FIG. 3 is a diagram depicting the configuration of the image sensor where the cyclic A/D converter is integrated into a column (parallel output)

Such cyclic A/D converters arranged in an array are useful to be used in the column of an image sensor, so that signals are supplied in parallel to perform A/D conversion. In this case, as FIG. 2 and FIG. 3 show, it is possible that noise cancellation circuits, for decreasing noise which the pixel section generates in a column, are arranged in a column, and the array of the above mentioned A/D converters is operated for the output of the noise cancellation circuits, but a more efficient circuit configuration is where a noise cancellation circuit or a circuit which performs amplification with a predetermined gain while canceling noise, and a cyclic A/D converter, are integrated, and a circuit for performing noise cancellation, amplification and A/D conversion is created using one amplifier.

Figure 10:
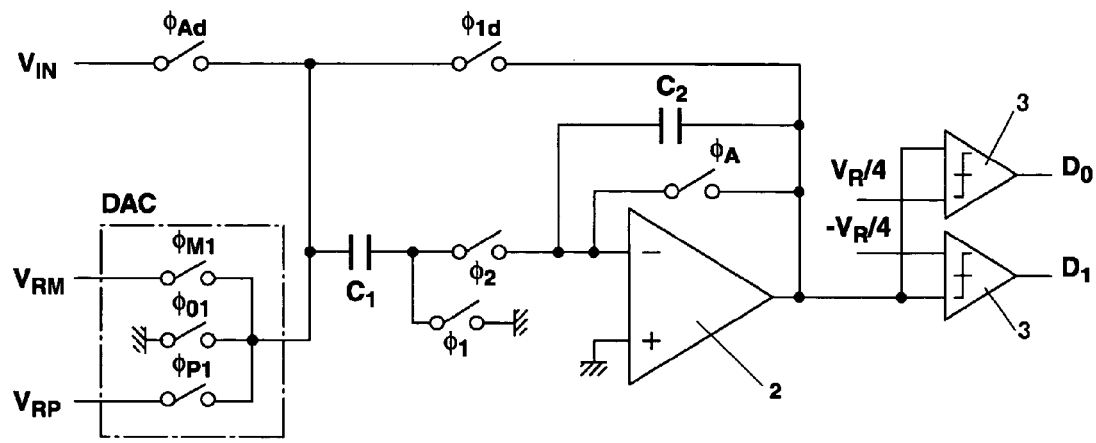
FIG. 10 is a diagram depicting the A/D converter for an image processor where noise cancellation and A/D conversion are integrated.

In the circuit shown in FIG. 10, a signal voltage (VS) by a light signal is applied to Vin. This voltage is sampled to C1. At this time, the other terminal of C1 is connected to the input of the inverting amplifier (2) where φA and φ2 are ON, and is almost at ground potential. Then the photo-diode section is reset after turning φA OFF, and the reset voltage VR is supplied to Vin. By this, the charges by the product of the voltage difference of VR−VS and C1 are transferred to C2, and the voltage of the amplifier output is changed. If the output voltage is Vout (0), this is given by the following expression.

[Expression 6]

$$V_{out}(0) = \frac{C_1}{C_2}(V_S - V_R) \quad (6)$$

In other words, the difference between the signal level of the pixel section and the reset level is amplified by the capacitance ratio of C1/C2, and the fixed pattern noise of the pixel section can be cancelled. For the output of the amplifier, 1.5-bit A/D conversion is performed using two comparators (3), and using this result, an operation to perform A/D conversion of the next digit is performed. The subsequent operation is the same as FIG. 4.

Figure 11:
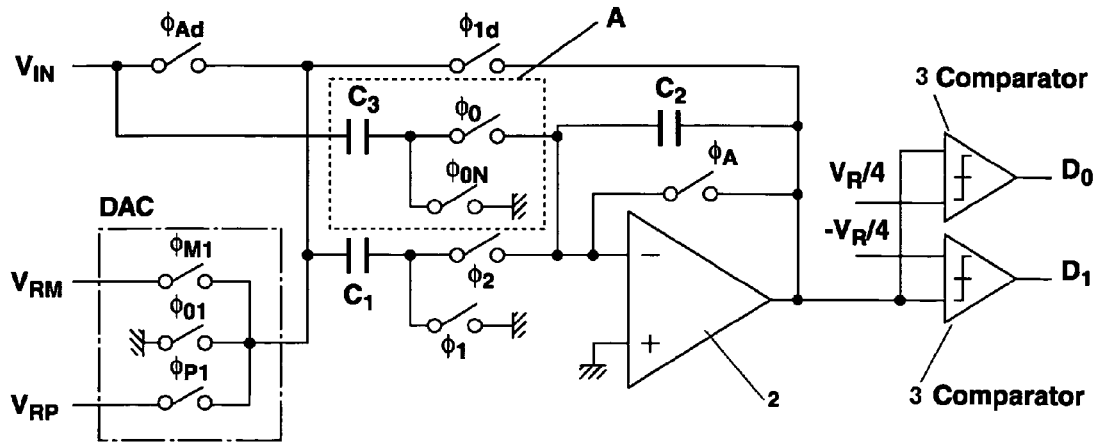
FIG. 11 is a diagram depicting the A/D converter for an image sensor where noise cancellation, amplification and A/D conversion are integrated.
Figure 12:
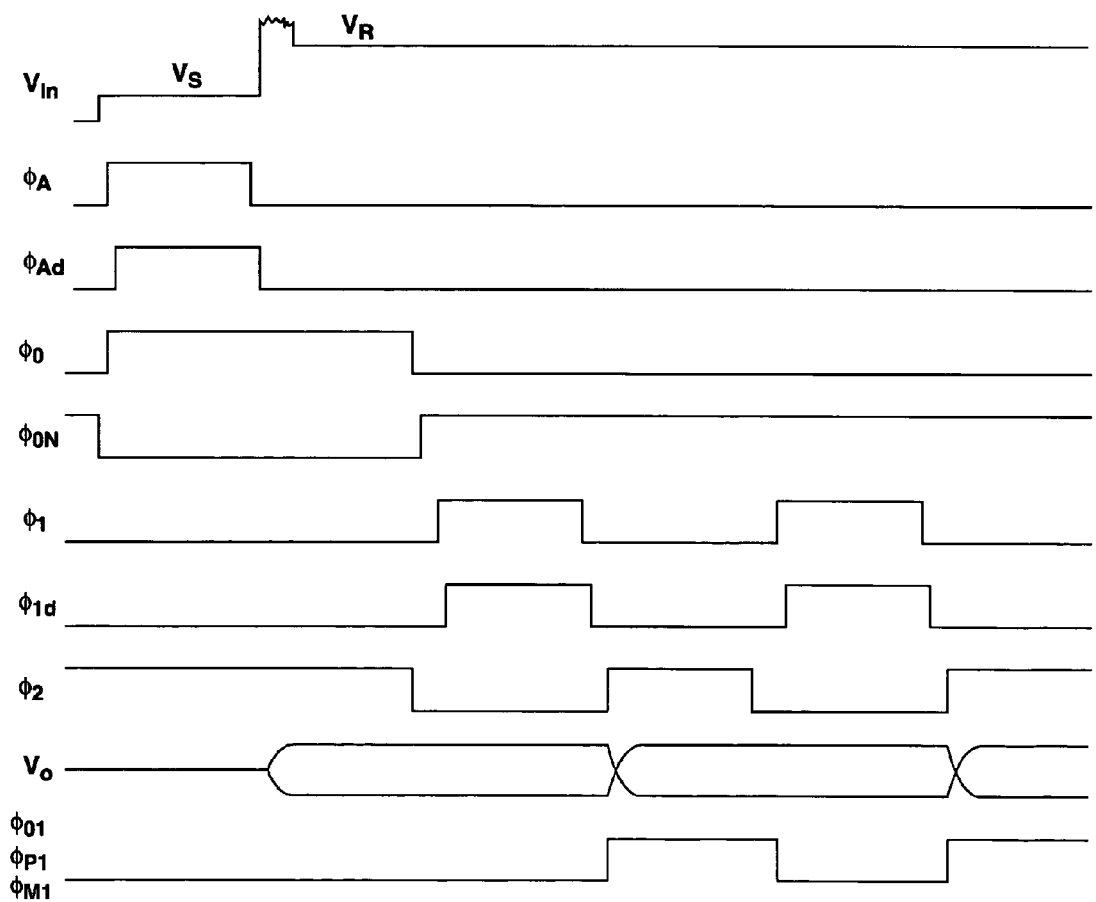
FIG. 12 is a timing chart depicting the operation of the circuit in FIG. 11.

The amplification gain in the circuit in FIG. 10 is determined by the capacitance ratio of C1/C2. When C1 is used for noise cancellation and A/D conversion, C1=C2 must be set, and then the ratio thereof is 1. With the foregoing in view, a circuit to increase the amplification degree by adding the third capacitor C3 to the input is proposed. FIG. 11 shows the circuit example thereof. FIG. 12 shows the operation timing chart thereof.

In FIG. 11, C3 is a capacitor to be used when amplification is performed, and if amplification is not performed (in other words if noise is cancelled by the gain 1), the portion of A enclosed by the broken line in FIG. 11 is deleted.

Figure 13:
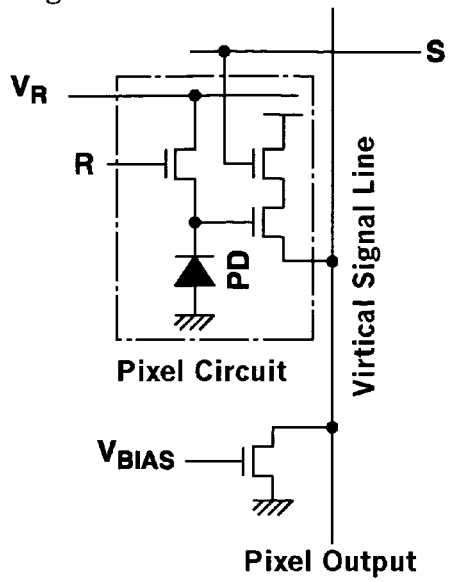
FIG. 13 is a diagram depicting the three-transistor pixel circuit.

By setting C3=(n−1) C0, C1=C2=C0, the noise-cancelled signals can be amplified by the gain n times. To Vin in FIG. 11, the pixel output of the amplification type image sensor using several transistors in a pixel in FIG. 13 is connected. In this example, the case of using three transistors (FIG. 13) is described as an example, but the present invention is not limited to this, but can be applied to other amplification type image sensors, such as four transistors and five transistors, where charges are transferred in a pixel.

In the case of a three-transistor amplification type image sensor, the voltage level (Vs), which is generated as a result of the signals stored in the photo-diode, is output to the selected pixels, and is sampled to C1 and C3 in FIG. 11. At this time the switch by φA is turned ON, the input and output of the inverting amplifier (2) are shorted in advance, and one of C1 and C3 is connected to the input of the inverting amplifier (2). Then the switch by φA is opened, the voltage stored in the photo-diode section is reset (switch by R is turned ON), and the reset voltage level of the photo-diode section (VR) at this time is supplied to Vin in FIG. 11. By this, the charges by the product of the voltage difference of VR−VS and C1+C3 are transferred to C2, and the voltage of the amplifier output is changed. If the output voltage thereof is Vout (0), this is given by the following expression.

[Expression 7]

$$V_{out}(0) = \frac{(C_1 + C_3)(V_S - V_R)}{C_2} = n(V_S - V_R) \quad (7)$$

In other words, the difference between the signal level of the pixel section and the reset level is amplified by n times, and cancellation of the fixed pattern noise of the pixel section and signal amplification can be performed. For the output of the amplifier, 1.5-bit A/D conversion is performed by two comparators (3), and using this result, an operation to perform A/D conversion of the next digit is executed. The subsequent operation is the same as the case in FIG. 4, and C3 is used only for the first amplification, and is not used for subsequent A/D conversion.

EXAMPLE 4

Figure 14:
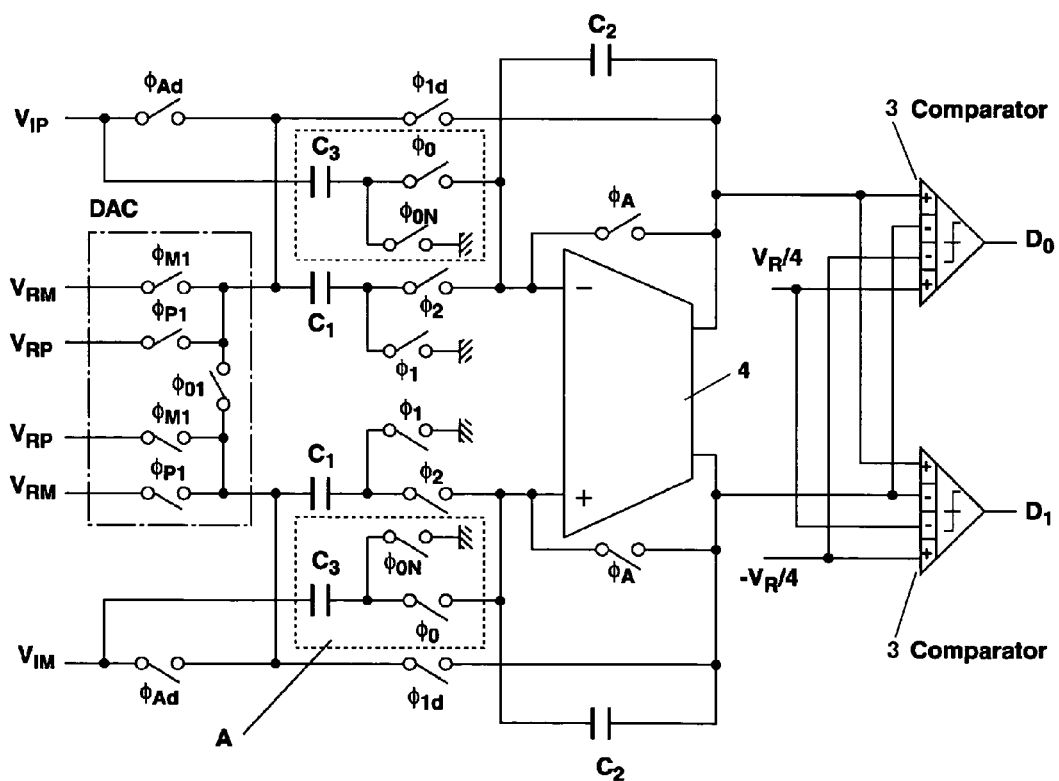
FIG. 14 is a diagram depicting a circuit example when the circuit in FIG. 11 is a full differential circuit configuration.

FIG. 11 shows circuits using an amplifier of which one terminal is grounded as an example, but this may be structured as a full differential circuit. FIG. 14 shows an example of circuits which perform processing similar to FIG. 11, where a full differential circuit is used. If amplification is not performed in FIG. 14, a portion of A is deleted.

In FIG. 14, which uses a full differential circuit, it is assumed that an input signal is supplied as the differential voltage of VIP and VIM. If the amplification type image sensor outputs the differential voltage via two signal lines in the pixel section, two inputs in FIG. 14 are connected to the vertical signal lines from the pixel section. If the signal from the pixel section is a single end signal and there is only one signal line, VIP in FIG. 14 is connected to the vertical signal line from the pixel section, and to VIM in FIG. 14 a predetermined voltage is supplied as a reference voltage in advance.

EXAMPLE 5

Figure 15:
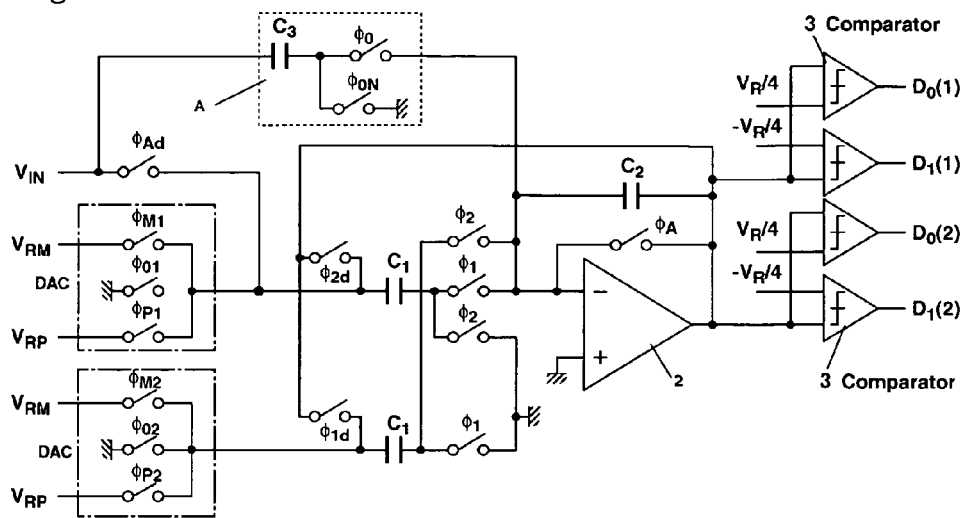
FIG. 15 is a diagram depicting a configuration when the circuit for performing A/D conversion in a half cycle and the noise cancellation and amplification functions are integrated.
Figure 16:
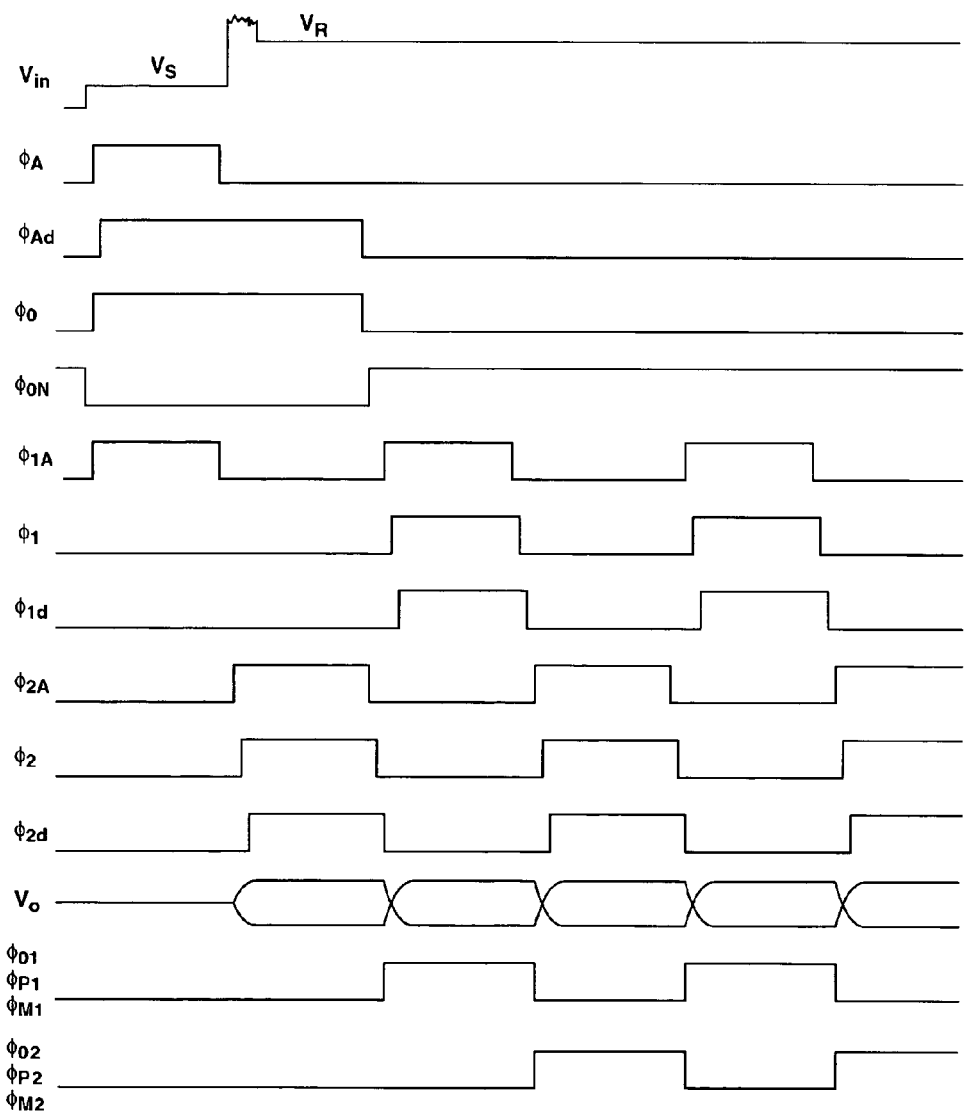
FIG. 16 is a timing chart depicting the operation of the circuit in FIG. 15.

FIG. 15 shows the circuit configuration when the method in FIG. 8, for performing 1.5-bit A/D conversion in a half cycle, is used in a column of the image sensor to perform the noise cancellation operation. FIG. 16 shows the operation timing chart thereof. This operation is roughly the same as the case of FIG. 11, but the two sets of the comparators (3) are alternately used at every half cycle, and the two comparators C1 are used for computation corresponding to Expression (5) and the sample and hold operation of the output at each half cycle.

Here two sets of comparators (3) are used for A/D conversion, but only one set of comparators may be used by installing a switching means for the input and output of one set of comparators, and by using time division.

The above is a configuration using a full differential circuit for the circuit in FIG. 11, but it is also possible to use a full differential circuit for FIG. 4, FIG. 8 and FIG. 15 in the same way, and these configurations can be easily analogized in FIG. 4, FIG. 8, FIG. 11 and FIG. 14.

EXAMPLE 6

In the above circuits, the number of capacitors and amplifiers can be decreased, but a function to cancel the offset voltage of the amplifier is not available, so it is necessary to remove the offset voltage of the amplifier and the offset voltage by injection of the switch. For this, the offset voltage, which is measured in advance, is subtracted for each column in the digital area. However there are some cases when this processing cannot be performed easily, and in such cases the circuits which are not influenced by the variation of the offset voltage of an amplifier very much must be used. In this case, another amplifier is required, but this extra amplifier may be used as the amplifier for noise cancellation of the image sensor for efficiency.

Figure 17:
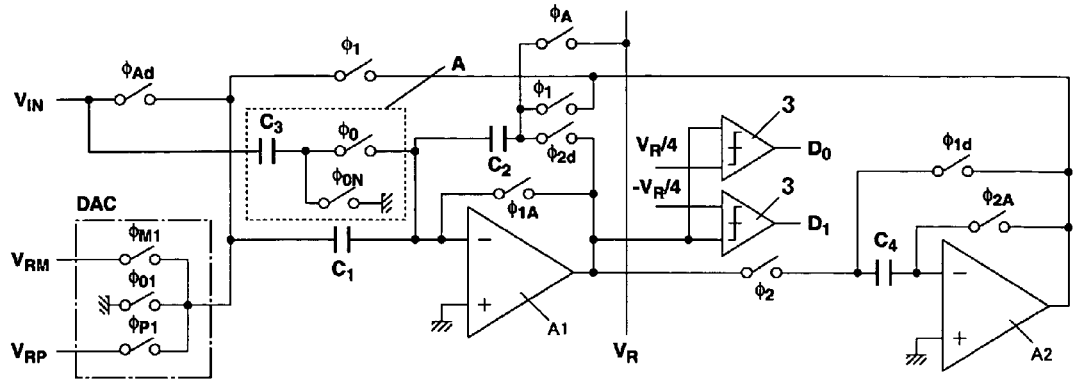
FIG. 17 is a diagram depicting the A/D converter for an image sensor in which an S/H amplifier is installed.
Figure 18:
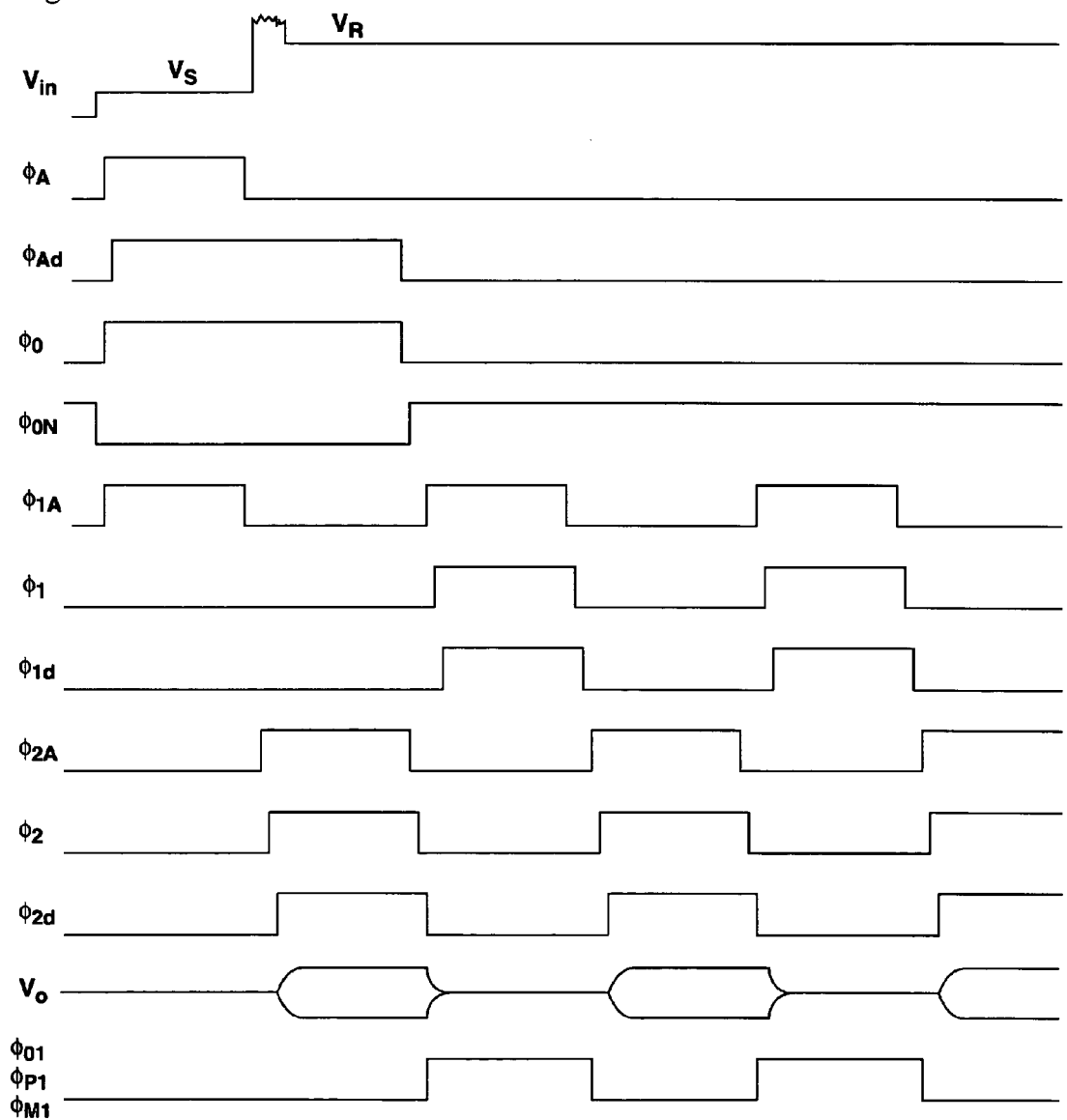
FIG. 18 is a timing chart depicting the operation of the circuit in FIG. 17.

FIG. 17 shows the circuit example thereof. FIG. 18 shows the operation timing thereof. When the signal level of the image sensor output is sampled, the image sensor output is first connected to the reference voltage $V_R$ by the switch controlled by φA, and is connected between the input and output of the amplifier by the switch controlled by φ2d when amplification is performed. By this, noise is cancelled and the offset voltage of the amplifier during amplification is cancelled. Also using the same amplifier, cyclic A/D conversion, which is a 1.5-bit A/D conversion per cycle, is performed. The output of the amplifier is stored by the sample and hold circuit. The sample and hold circuit stores voltage when the input and output of the amplifier A2 is shorted by the switch controlled by φ2A in the capacitor C4 as the reference, then the switches controlled by φ2 and φ2A are opened, and C4 is connected between the input and output of the amplifier by the switch controlled by φ1d. Because of this, the sample and hold circuit is not influenced by the offset voltage of the amplifier.

Then for the A/D conversion of the next digit, the output of the sample and hold circuit is sampled to C1 and C2 of the circuit in the previous stage. At this time, the voltage, when the input and output of the amplifier A1 is shorted, is sampled by the switch controller by φ1A as a reference, then C2 is connected between the input and output of the amplifier by the switch controlled by φ2A, and one terminal of C1 is connected to the output of the DAC, whereby computation the same as Expression (3) is performed, and this operation as well is not influenced by the offset voltage of the amplifier A1. In this way at both noise cancellation and A/D conversion, an operation which is not influenced by the offset voltage of the amplifier becomes possible.

The above is the case when 1.5-bit A/D conversion per cycle is repeated using two comparators, but a method of repeating 1-bit A/D conversion using one comparator, or a method of cycling multi-bit A/D conversion per cycle using a plurality of comparators and setting the amplification gain of the amplifier 4 times, 8 times or 16 times is also possible, and these methods shall not be excluded from the scope of the present invention.

Figure 19:
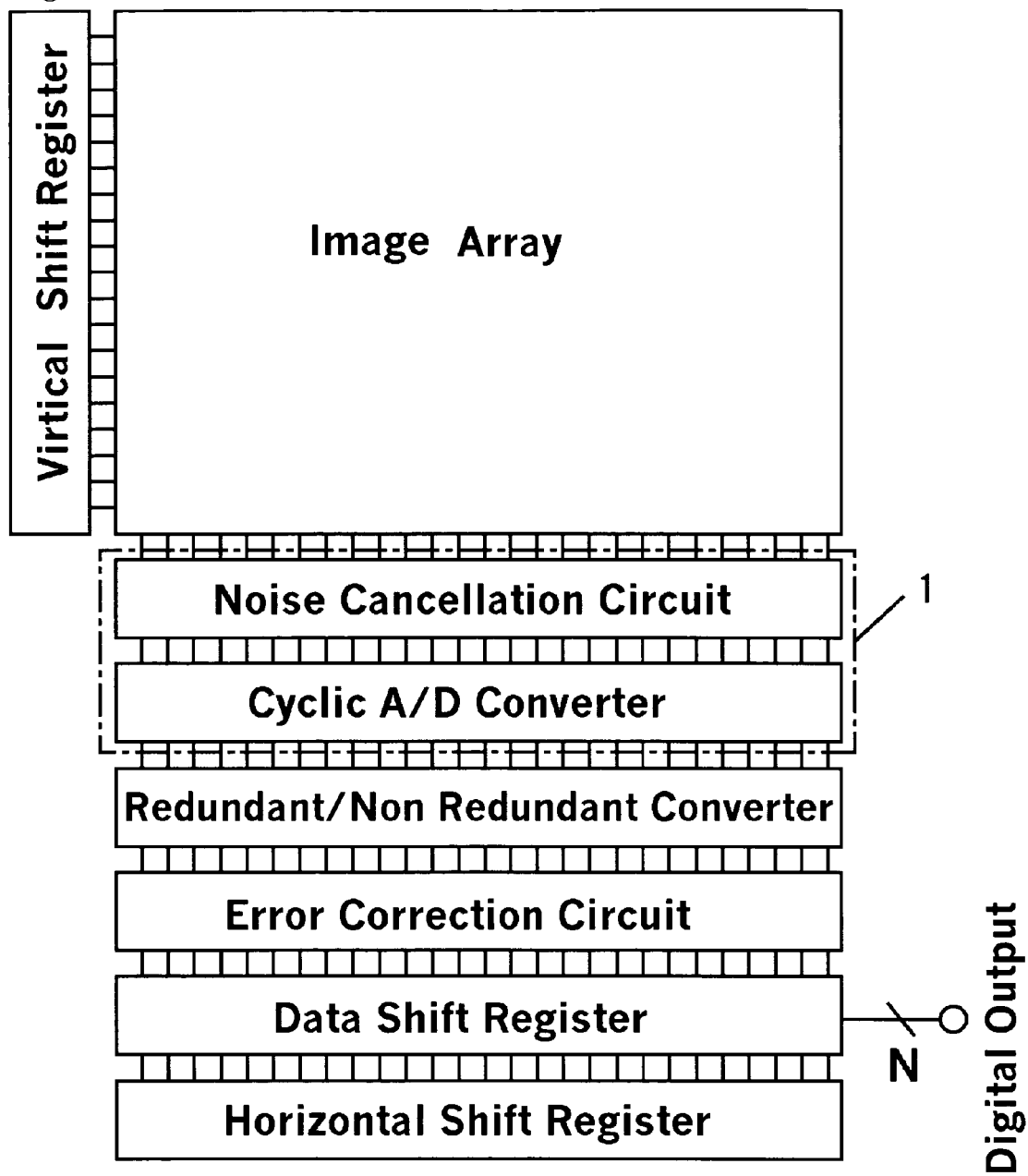
FIG. 19 is a diagram depicting the configuration when error correction of ADC is performed in the column of the image sensor.

Also a circuit, to correct an error generated by the variation of characteristics of the cyclic ADC and a noise cancellation circuit, may be integrated in a column as shown in FIG. 19.

Here the inverting amplifier having differential input was used for describing the inverting amplifier (2), but it is obvious that a similar circuit can be structured by using an inverting amplifier having single end input without differential input, and the present invention shall not exclude the use of these other amplifiers.

INDUSTRIAL APPLICABILITY

The present invention provides a method for performing high resolution A/D conversion at high-speed by arranging cyclic A/D converters in an array in the columns of an image sensor, and a method for implementing a high-speed image sensor using the above method. Particularly it is a characteristic of the present invention that the number of amplifiers and the number of capacitors are decreased compared with a conventional cyclic type, and cyclic A/D conversion is performed using an amplifier in a column for canceling noise (reset noise, fixed pattern noise) generated at the pixel section of the image sensor. By this, area and power consumption can be decreased.

The invention claimed is:

1. An A/D conversion array comprising arrayed unit circuits, each of which comprises:
    a first circuit element arranged to perform A/D conversion of multiple bits per cycle;
    a second circuit element arranged to convert a digital output of said first circuit element to a resulting analog conversion signal by first switching means, and
    a first capacitor;
    amplification means arranged to amplify an analog input, the amplification means comprising a second capacitor for determining gain from a ratio of capacitance of the second capacitor and said first capacitor, the second capacitor being connectable between an input and an output of an inverting amplifier to subtract the analog conversion signal from the analog input;
    a third circuit element arranged to sample and hold an output of said amplification means by second switching means and said first capacitor; and
    third switching means arranged to select one of the output of said amplification means and an input signal and to supply the selected signal to said amplification means as input, via said first capacitor, the A/D conversion array being characterized in that:
    control means arranged to control said first to third switching means is installed outside the array, and the arrayed unit circuits are arranged such that cyclic multi-bit A/D conversion is performed when the input signal is supplied as an input of said amplification means in a first stage, and a signal from said third circuit element is supplied to the input of said amplification means in a next stage.

2. The A/D conversion array according to claim 1, wherein two first capacitors are arranged to be used for D/A conversion with said amplification means, and a conversion speed per cycle is doubled by alternately using said two first capacitors for D/A conversion and for sampling and holding.

3. The A/D conversion array according to claim 1, wherein said circuit element arranged to perform A/D conversion of N-bits is arranged to divide input analog signals into three voltage ranges, and to assign values 1, 0 and −1 to the three ranges.

4. The A/D conversion array according to claim 1, wherein an amplifier in said amplification means is a differential amplifier having a differential input and a differential output, and a full differential circuit is structured by said differential amplifier, a capacitor and switching means.

5. An image sensor, arranged to perform A/D conversion in parallel for outputs of elements of an image sensor array thereof comprising an A/D conversion array as claimed in any one of claims 1 to 4 located in a column of the image sensor array.

6. The image sensor according to claim 5, further comprising a noise cancellation circuit in a column of said image sensor array, wherein said noise cancellation circuit comprises a noise cancellation inverting amplifier, a first noise cancellation capacitor connected between the Output of the image sensor array and the input of said noise cancellation inverting amplifier, and a second noise cancellation capacitor connected between the input and output of said noise cancellation inverting amplifier, and switching means arranged such that, and the inverting amplifier in said A/D conversion array is also arranged to be used as the noise cancellation inverting amplifier of said noise cancellation circuit, said first capacitor is also arranged to be used as said first noise cancellation capacitor, and said second capacitor is also arranged to used as said second noise cancellation capacitor.

7. The image sensor according to claim 6, further comprising a fifth capacitor arranged to be connected between the output of the image sensor array and input of the inverting amplifier only during a noise cancellation operation, characterized in that an amplification function is acquired by a ratio of a sum of the capacitance of the first capacitor and the third capacitor with said second capacitor.

* * * * *